(12) United States Patent
Tabirian et al.

(10) Patent No.: US 9,983,479 B2
(45) Date of Patent: May 29, 2018

(54) FABRICATION OF HIGH EFFICIENCY, HIGH QUALITY, LARGE AREA DIFFRACTIVE WAVEPLATES AND ARRAYS

(71) Applicants: The United States of America as Represented by the Secretary of the Army, Washington, DC (US); Beam Engineering for Advanced Measurements Co., Orlando, FL (US)

(72) Inventors: Nelson V. Tabirian, Winter Park, FL (US); Sarik R. Nersisyan, Maitland, FL (US); Brian R. Kimball, Shrewsbury, MA (US); Diane M. Steeves, Franklin, MA (US)

(73) Assignees: Beam Engineering for Advanced Measurements Co., Orlando, FL (US); The United States of America as Represented by the Secretary of the Army, Washington, DC (US)

( * ) Notice: Subject to any disclaimer, the term of this patent is extended or adjusted under 35 U.S.C. 154(b) by 935 days.

(21) Appl. No.: 14/048,557

(22) Filed: Oct. 8, 2013

(65) Prior Publication Data

US 2014/0092373 A1    Apr. 3, 2014

Related U.S. Application Data

(63) Continuation-in-part of application No. 13/860,934, filed on Apr. 11, 2013, now abandoned, and a
(Continued)

(51) Int. Cl.
*G03H 1/10*    (2006.01)
*G03F 7/20*    (2006.01)
(Continued)

(52) U.S. Cl.
CPC ............ *G03F 7/20* (2013.01); *G02B 5/3083* (2013.01); *G02B 5/32* (2013.01); *G03H 2001/0439* (2013.01); *G03H 2260/51* (2013.01)

(58) Field of Classification Search
CPC . G03F 7/00–7/001; G03F 7/20–7/2006; G03F 7/26; G03F 7/70158;
(Continued)

(56) References Cited

U.S. PATENT DOCUMENTS 2,435,616 A    2/1948 Vittum
3,721,486 A    3/1973 Bramley
(Continued)

FOREIGN PATENT DOCUMENTS

EP    1970734    9/2008
EP    2088456    12/2009
(Continued)

OTHER PUBLICATIONS

Photo-generation of Linearly Polymerized Liquid crystal Aligning layers Comprising Novel Integrated Optically Patterned Retarders and Color Filters, Schadt et al, (Jpn. J. Appl. Phys., vol. 34, Jun. 1995, pp. 3240-3249, Part I, No. 6A).*
(Continued)

*Primary Examiner* — Jade R Chwasz
*Assistant Examiner* — Jyotsna Dabbi
(74) *Attorney, Agent, or Firm* — Brian S. Steinberger; Law Offces of Brian S. Steinberger, P.A.

(57) ABSTRACT

An apparatus and method for fabricating high quality one- or two-dimensional diffractive waveplates and arrays that exhibit high diffraction efficiency and capable of inexpensive large volume production. A generally non-holographic and aperiodic polarization converter for converting the polarization of a coherent input light beam of a visible
(Continued)

wavelength into a pattern of continuous spatial modulation at the output of the polarization converter. A photoresponsive material characterized by an anisotropy axis according to polarization of the light beam is exposed to a polarization modulation pattern and coated subsequently with an anisotropic material overlayer with ability of producing an optical axis orientation according to and under the influence of the anisotropy axis of the photoresponsive material layer. The diffractive waveplates are obtained when exposure time of photoresponsive material layer exceeds an order of magnitude the time period that is known to produce spatially homogeneous orientation of the anisotropic overlayer.

19 Claims, 6 Drawing Sheets

Related U.S. Application Data continuation-in-part of application No. 12/662,525, filed on Apr. 21, 2010, now abandoned.

(51) Int. Cl.
  *G02B 5/30* (2006.01)
  *G02B 5/32* (2006.01)
  *G03H 1/04* (2006.01)

(58) Field of Classification Search
  CPC ... G03F 7/70383; G03F 7/70566; G02B 5/30; G02B 5/3016; G02B 5/3025; G02B 5/3041; G02B 5/305; G02B 5/3083; G02B 5/3091; G03H 2260/50–2260/51; G03H 2001/0439; G02F 1/133528; G02F 2001/133538
  USPC ...... 355/71, 77; 359/485.01, 485.03, 485.05, 359/486.01, 486.02, 486.03, 487.01, 359/487.02, 487.03, 487.04, 487.05, 359/487.06, 489.01, 489.07, 489.15, 359/489.16, 10
  See application file for complete search history.

(56) References Cited

U.S. PATENT DOCUMENTS

| | | | |
|---|---|---|---|
| 3,897,136 A | 7/1975 | Bryngdahl | |
| 4,160,598 A | 7/1979 | Firester et al. | |
| 4,301,023 A | 11/1981 | Schuberth | |
| 4,956,141 A | 9/1990 | Allen | |
| 4,983,332 A | 1/1991 | Hahn | |
| 5,032,009 A | 7/1991 | Gibbons et al. | |
| 5,042,950 A | 8/1991 | Salmon, Jr. | |
| 5,047,847 A | 9/1991 | Toda | |
| 5,100,231 A | 3/1992 | Sasnett et al. | |
| 5,142,411 A | 8/1992 | Fiala | |
| 5,218,610 A | 6/1993 | Dixon | |
| 5,325,218 A | 6/1994 | Willett | |
| 5,446,596 A | 8/1995 | Mostrorocco | |
| 5,621,525 A | 4/1997 | Vogeler et al. | |
| 5,895,422 A | 4/1999 | Hauber | |
| 5,903,330 A | 5/1999 | Funfschilling et al. | |
| 5,989,758 A | 11/1999 | Komatsu | |
| 6,107,617 A | 8/2000 | Love et al. | |
| 6,139,147 A | 10/2000 | Zhang | |
| 6,191,880 B1 * | 2/2001 | Schuster | G02B 5/3083 359/237 |
| 6,219,185 B1 | 4/2001 | Hyde | |
| 6,320,663 B1 | 11/2001 | Ershov | |
| 6,373,549 B1 | 4/2002 | Tombling et al. | |
| 6,452,145 B1 | 9/2002 | Graves et al. | |
| 6,551,531 B1 | 4/2003 | Ford | |
| 6,678,042 B2 | 1/2004 | Tabirian et al. | |
| 6,728,049 B1 | 4/2004 | Tabirian et al. | |
| 6,792,028 B2 | 9/2004 | Cook | |
| 7,048,619 B2 | 5/2006 | Park | |
| 7,094,304 B2 | 8/2006 | Nystrom | |
| 7,095,772 B1 | 8/2006 | Delfyett et al. | |
| 7,196,758 B2 | 3/2007 | Crawford et al. | |
| 7,319,566 B2 | 1/2008 | Prince | |
| 7,324,286 B1 | 1/2008 | Glebov | |
| 7,450,213 B2 | 11/2008 | Kim | |
| 7,764,426 B2 | 7/2010 | Lipson | |
| 8,045,130 B2 | 10/2011 | Son | |
| 8,077,388 B2 | 12/2011 | Gerton | |
| 8,264,623 B2 | 9/2012 | Marrucci | |
| 8,520,170 B2 | 8/2013 | Escuti | |
| 8,582,094 B1 * | 11/2013 | Shortt | G01N 21/9501 356/237.1 |
| 8,643,822 B2 | 2/2014 | Tan et al. | |
| 8,982,313 B2 | 3/2015 | Escuti et al. | |
| 9,541,772 B2 | 1/2017 | De Sio et al. | |
| 9,557,456 B2 | 1/2017 | Tabirian et al. | |
| 9,592,116 B2 | 3/2017 | De Sio et al. | |
| 9,617,205 B2 | 4/2017 | Tabirian et al. | |
| 9,658,512 B2 | 5/2017 | Tabirian et al. | |
| 9,715,048 B2 | 7/2017 | Tabirian et al. | |
| 9,753,193 B2 | 9/2017 | Tabirian et al. | |
| 2001/0002895 A1 | 6/2001 | Kawano | |
| 2001/0018612 A1 | 8/2001 | Carson et al. | |
| 2001/0030720 A1 | 10/2001 | Ichihashi | |
| 2002/0027624 A1 * | 3/2002 | Seiberle | G02B 5/3016 349/73 |
| 2002/0097361 A1 | 7/2002 | Ham | |
| 2002/0167639 A1 | 11/2002 | Coates | |
| 2003/0021526 A1 | 1/2003 | Bouevitch | |
| 2003/0072896 A1 | 4/2003 | Kwok | |
| 2003/0152712 A1 | 8/2003 | Motomura | |
| 2003/0206288 A1 | 11/2003 | Tabirian et al. | |
| 2003/0218801 A1 | 11/2003 | Korniski | |
| 2004/0105059 A1 | 6/2004 | Ohyama | |
| 2004/0165126 A1 | 8/2004 | Ooi et al. | |
| 2005/0030457 A1 | 2/2005 | Kuan | |
| 2005/0110942 A1 | 5/2005 | Ide | |
| 2005/0219696 A1 * | 10/2005 | Albert | G02B 5/3058 359/486.01 |
| 2005/0271325 A1 | 12/2005 | Anderson et al. | |
| 2006/0008649 A1 | 1/2006 | Shinichiro | |
| 2006/0055883 A1 | 3/2006 | Morris et al. | |
| 2006/0109532 A1 | 5/2006 | Savas | |
| 2006/0221449 A1 | 10/2006 | Glebov et al. | |
| 2006/0222783 A1 | 10/2006 | Hayashi | |
| 2007/0032866 A1 | 2/2007 | Portney | |
| 2007/0040469 A1 | 2/2007 | Yacoubian et al. | |
| 2007/0115551 A1 | 5/2007 | Spilman | |
| 2007/0122573 A1 | 5/2007 | Yasuike | |
| 2007/0132930 A1 | 6/2007 | Ryu | |
| 2007/0247586 A1 | 10/2007 | Tabirian | |
| 2007/0258677 A1 | 11/2007 | Chigrinov | |
| 2008/0226844 A1 | 9/2008 | Shemo | |
| 2008/0278675 A1 | 11/2008 | Escuti et al. | |
| 2009/0002588 A1 | 1/2009 | Lee | |
| 2009/0073331 A1 | 3/2009 | Shi | |
| 2009/0122402 A1 | 5/2009 | Shemo | |
| 2009/0141216 A1 * | 6/2009 | Marrucci | G02F 1/0305 349/98 |
| 2009/0256977 A1 | 10/2009 | Haddock | |
| 2009/0257106 A1 * | 10/2009 | Tan | G02B 27/48 359/279 |
| 2009/0264707 A1 | 10/2009 | Hendricks | |
| 2010/0003605 A1 | 1/2010 | Gil | |
| 2010/0066929 A1 * | 3/2010 | Shemo | G02B 5/3083 349/18 |
| 2011/0069377 A1 | 3/2011 | Wu et al. | |
| 2011/0075073 A1 | 3/2011 | Oiwa | |
| 2011/0085117 A1 | 4/2011 | Moon | |
| 2011/0097557 A1 | 4/2011 | May | |
| 2011/0109874 A1 | 5/2011 | Piers et al. | |
| 2011/0135850 A1 | 6/2011 | Saha et al. | |
| 2011/0188120 A1 | 8/2011 | Tabirian et al. | |
| 2011/0234944 A1 | 9/2011 | Powers | |
| 2011/0262844 A1 | 10/2011 | Tabirian | |

(56) References Cited

U.S. PATENT DOCUMENTS

| | | |
|---|---|---|
| 2012/0140167 A1 | 6/2012 | Blum |
| 2012/0162433 A1 | 6/2012 | Fuentes |
| 2012/0188467 A1 | 7/2012 | Escuti |
| 2013/0057814 A1 | 3/2013 | Prushinskiy |
| 2014/0055740 A1 | 2/2014 | Spaulding |
| 2014/0211145 A1 | 7/2014 | Tabirian |
| 2014/0252666 A1 | 9/2014 | Tabirian |
| 2015/0049487 A1 | 2/2015 | Connor |
| 2015/0081016 A1 | 3/2015 | De Sio et al. |
| 2015/0276997 A1 | 10/2015 | Tabirian et al. |
| 2016/0023993 A1 | 1/2016 | Tabirian |
| 2016/0047955 A1 | 2/2016 | Tabirian et al. |
| 2016/0047956 A1 | 2/2016 | Tabirian et al. |
| 2017/0010397 A1 | 1/2017 | Tabirian et al. |

FOREIGN PATENT DOCUMENTS

| | | | |
|---|---|---|---|
| GB | 2209751 | 5/1989 | |
| JP | 2001142033 | 5/2001 | |
| JP | 2004226752 | 8/2004 | |
| WO | 2007122573 | 11/2007 | |
| WO | WO2008130559 A2 * | 4/2008 | ............ G02F 1/1337 |
| WO | WO2008130555 A1 * | 10/2008 | ................ G02B 5/30 |

OTHER PUBLICATIONS

Sh. D. Kakichashvili, Method for phase polarization recording of holograms, Sov. J. Quantum. Electron., vol. 4, No. 6, Dec. 1974, 5 pages.
T. Todorov, et al., High-Sensitivity Material With Reversible Photo-Induced Anisotropy, Optics Communications, vol. 47, No. 2, Aug. 15, 1983, 4 pages.
M. Attia, et al., Anisoptropic Gratings Recorded From Two Circularly Polarized Coherent Waves, Optics Communications, vol. 47, No. 2, Aug. 15, 1983, 6 pages.
G. Cipparrone, et al., Permanent polarization gratings in photosensitive langmuir-blodget films, Applied Physics Letter, vol. 77, No. 14 Oct. 2, 2000, 4 pages.
L. Nikolova et al., Diffraction Efficiency and Selectivity of Polarization Holographic Recording, Optica Acta: International Journal of Optics, vol. 31, No. 5, 1984, 11 pages.
K. Ichimura, et al., Reversible Change in Alignment Mode of Nematic Liquid Crystals Regulated Photochemically by Command Surfaces Modified with an Azobenzene Monolayer, Langmuir, vol. 4, No. 5, 1988, 3 pages.
W.M. Gibbons, et al., Surface-mediated alignment of nematic liquid crystals with polarized laser light, Nature vol. 351, May 2, 1991, 1 page.
W.M. Gibbons, et al., Optically Controlled Alignment of Liquid Crystals: Devices and Applications, Molecular Crystals Liquid Crystals, vol. 251, 1994, 19 pages.
W.M. Gibbons, et al., Optically generated liquid crystal gratings, Applied Physics Letter. vol. 65, No. 20, Nov. 14, 1994, 3 pages.
M. Schadt, et al., Optical patterning of multi-domain liquid-crystal displays with wide viewing angles, Nature, vol. 381, May 16, 1996, 4 pages.
S.R. Nersisyan, et al., Optical Axis Gratings in Liquid Crystals and Their Use for Polarization Insensitive Optical Switching, Journal of Nonlinear Optical Physics & Materials, vol. 18, No. 1, 2009, 47 pages.
N.V. Tabiryan, et al., The Promise of Diffractive Waveplates, OPN Optics and Photonics News, Mar. 2010, 6 pages.
H. Sarkissian, et al., Potential application of Periodically Aligned Liquid Crystal cell for projection displays, JThE12, 2005, 3 pages.
Boris Ya. Zel'dovich, N.V. Tabirian, Devices for displaying visual information, Disclosure, School of Optics/CREOL, University of Central Florida, Jul. 2000, 10 pages.
C. Provenzano, et al., Highly efficient liquid crystal based diffraction grating induced by polarization holograms at the aligning surfaces, AppliedPhysics Letter 89, 2006, 4 pages.
M.J. Escuti et al., A Polarization-Independent Liquid Crystal Spatial-Light-Modulator, Proc. SPIE vol. 6332, No. 53320M, 2006, 9 pages.
C.M. Titus et al., Efficient, polarization-independent, reflective liquid crystal phase grating, Applied Physics Letter 71, Oct. 20, 1997, 3 pages.
J. Chen, et al., An Electrooptically Controlled Liquid-Crystal Diffraction Grating, Applied Physics Letter 67, Oct. 30, 1995, 4 pages.
B. J. Kim, et al. Unusual Characteristics of Diffraction Gratings in a Liquid Crystal Cell, Advanced Materials, vol. 14, No. 13-14, Jul. 4, 2002. 7 pages.
R.-P. Pan, et al., Surface Topography and Alignment Effects in UV-Modified Polyimide Films with Micron Size Patterns, Chinese Journal of Physics, vol. 41, No. 2, Apr. 2003, 8 pages.
A.Y.-G Fuh, et al. Dynamic studies of holographic gratings in dye-doped liquid-crystal films, Optics Letter, vol. 26, No. 22, Nov. 15, 2001, 3 pages.
C.-J.Yu, et al. Polarization Grating of Photoaligned Liquid Crystals with Oppositely Twisted Domain Structures, Molecular Crystals Liquid Crystals, vol. 433, 2005, 7 pages.
G. Crawford, et al., Liquid-crystal diffraction gratings using polarization holography alignment techniques, Journal of Applied Physics 98, 2005, 10 pages.
M. Schadt, et al., Photo-Induced Alignment and Patterning of Hybrid Liquid Crystalline Polymer Films on Single Substrates, Jpn. J. Applied Physics, vol. 34, Part 2, No. 6B, Jun. 15, 1995, 4 pages.
M. Schadt, et al. Photo-Generation of Linearly Polymerized Liquid Crystal Aligning Layers Comprising Novel, Integrated Optically Patterned Retarders and Color Filters, Jpn. J. Applied Physics, vol. 34, Part 1, No. 6A, Jun. 1995, 10 pages.
H. Seiberle, et al., 38.1 Invited Paper: Photo-Aligned Anisotropic Optical Thin Films, SID 03 Digest, 2003, 4 pages.
B. Wen, et al. Nematic liquid-crystal polarization gratings by modification of surface alignment, Applied Optics, vol. 41, No. 7, Mar. 1, 2002, 5 pages.
J. Anagnostis, D. Rowe, Replication produces holographic optics in volume, Laser Focus World, vol. 36, Issue 3, Mar. 1, 2000, 6 pages.
M.T. Gale, Replicated Diffractive Optics and Micro-Optics, Optics and Photonics News, Aug. 2003, 6 pages.
S.R. Nersisyan, et al., Characterization of optically imprinted polarization gratings, Applied Optics, vol. 48, No. 21, Jul. 20, 2009, 6 pages.
H. Sarkissian, et al., Periodically Aligned Liquid Crystal: Potential Application for Projection Displays, Molecular Crystals Liquid Crystals, vol. 451, 2006, 19 pages.
S.C. McEldowney et al., Creating vortex retarders using photoaligned LC polymers, Optics Letter, vol. 33, No. 2, Jan. 15, 2008, 3 pages.
Tabiryan, et al., Fabricating Vector Vortex Waveplates for Coronagraphy; Aerospace Conference, 2012, EEE; publicly available Apr. 19, 2012, 12 pages.
Tabirian, et al., PCT Application No. PCT/US15/26186 filed Apr. 16, 2015, Notification of Transmittal of the International Search Report and the Written Opinion of the International Searching Authority dated Jul. 14, 2015, 17 pages.
Nersisyan, et al., Study of azo dye surface command photoalignment material for photonics applications, Applied Optics, vol. 49, No. 10, Apr. 1, 2010, 8 pages.
Nersisyan, et al., Fabrication of Liquid Crystal Polymer Axial Waveplates for UV-IR Wavelengths, Optics Express, vol. 17, No. 14, Jul. 2009, 9 pages.
Nersisyan, et al., Polarization insensitive imaging through polarization gratings, Optics Express, vol. 17, No. 3, Feb. 2, 2009, 14 pages.
Sarkissian, et al., Longitudinally modulated nematic bandgap structure, Optical Society of America, vol. 23, No. 8, Aug. 2008, 6 pages.
Sarkissian, et al., Polarization-universal bandgap in periodically twisted nematics, Optics Letters, vol. 31, No. 11, Jun. 1, 2006, abstract, 4 pages.
Sarkissian, et al., Polarization-Controlled Switching Between Diffraction Orders in Transverse-Periodically Aligned Nematic Liquid Crystals, Optics Letters, Aug. 2006, abstract, 4 pages.

(56) References Cited

OTHER PUBLICATIONS

Escuti, et al., Polarization-Independent LC Microdisplays Using Liquid Crystal Polarization Gratings: A Viable Solution (?), Dept of Electrical & Computer Engineering @ ILCC, Jul. 1, 2008, 30 pages.
Escuti, et al., Simplified Spectropolarimetry Using Reactive Mesogen Polarization Gratings, Imaging Spectrometry XI, Proc. of SPIE, vol. 6302, 2006, 11 pages.
University of Central Florida, School of Optics CREOL PPCE, Optics in the Southeast, Technical Conference and Tabletop Exhibit, Nov. 12-13, 2003, 9 pages.
Ichimura, et al., Surface assisted photoalignment control of lyotropic liquid crystals, Part 1, Characterization and photoalignment of aqueous solutions of a water soluble dyes as lyotropic liquid crystals, J. Materials. Chem., vol. 12, 2002, abstract, 2 pages.
Lee et al., "Generation of pretilt angles of liquid crystals on cinnamte-based photoalignment . . . ", Opt., Expr., vol. 17 (26) (Dec. 2009), abstract, 4 pages.
Yaroshchuk et al. "Azodyes as photoalignment agents for polymerizable liquid crystals", IDW'06 Digest vol. 1-3, 2006, 4 pages.
Chigrinov et al. "Anchoring properties of photoaligned azo-dye materials" Phys. Rev., E vol. 68, (Dec. 2003), 5 pages.
Pagliusi et al. Surface-induced photorefractivity in twistable nematics: toward the all-optical control of gain, Opt. Expr. vol. 16, Oct. 2008, 9 pages.
M. Honma, T. Nose, Polarization-independent liquid crystal grating fabricated by microrubbing process, Jpn. J. Appl. Phys., Part 1, vol. 42, 2003, 3 pages.
Anderson, G., et al., Broadband Antihole Photon Sieve Telescope, Applied Optics, vol. 16, No. 18., Jun. 2007, 3 pages.
Early, J. et al., Twenty Meter Space Telescope Based on Diffractive Fresnel Lens, SPIE, U.S. Department of Energy, Lawrence Livermore National Laboratory, Jun. 2003, 11 pages.
Martinez-Cuenca, et al., Reconfigurable Shack-Hartmann Sensor Without Moving Elements,Optical Society of America, vol. 35, No. 9, May 2010, 3 pages.
Serak, S., et al., High-efficiency 1.5 mm Thick Optical Axis Grating and its Use for Laser Beam Combining, Optical Society of America, vol. 32, No., Jan. 2007, 4 pages.
Ono et al., Effects of phase shift between two photoalignment substances on diffration properties in liquid crystalline grating cells, Appl. Opt. vol. 48, Jan. 2009, 7 pgs.
Naydenova et al., "Diffraction form polarization holographic gratings with surface relief in side chain azobenzene polyesters" J. Opt. Soc. Am. B, vol. 15, (1998), 14 pages.
Oh et al., Achromatic polarization gratings as highly efficent thin-film polarizing beamsplitters for broadband light Proc. SPIE vol. 6682, (2007), 4 pages.
Nersisyan, S., et al., Polarization insensitive imaging through polarization gratins, Optics Express, vol. 17, No. 3, Feb. 2, 2009, 14 pages.
OISE, Optics in the Southeast, Technical Conference and Tabletop Exhibit, Optical Society of America, Orlando, FL., Nov. 12-13, 2003, 9 pages.
Dierking, Polymer Network-Stabilized Liquid Crystals, Advanced Materials, vol. 12, No. 3, 2000, 15 pages.

Tabiryan, et al., Broadband waveplate lenses, Optics Express 7091, vol. 24, No. 7, Mar. 24, 2016, 12 pages.
Tabiryan, et al. Thin waveplate lenses of switchable focal length—new generation in optics, Optics Express 25783, vol. 23, No. 20, Sep. 19, 2015, 12 pages.
Tabiryan, et al. Superlens in the skies: liquid-crystal-polymer technology for telescopes, Newsroom, 2016, 2 pages.
Niersisyan, et al., The principles of laser beam control with polarization gratings introduced as diffractive waveplates, Proc. of SPIE, vol. 7775, 2010, 10 pages.
Heller, A Giant Leap for Space Telescopes, Foldable Optics, S&TR, Mar. 2003, 7 pages.
Beam Engineering for Advanced Measurements Co., PCT Application No. PCT/US2015026186, The Extended European Search Report, filed on Mar. 8, 2017, 13 pages.
Blinov, et al., Electrooptic Effects in Liquid Crystal MAterials, Springer-Verlag New York, 1994, 17 pages.
Crawford, et al., Liquid Crystals in Complex Geometries; Formed by Polymer and Porous Networks, Taylor and Francis, 1996, 4 pages.
Honma, et al., Liquid-Crystal Fresnel Zone Plate Fabricated by Microorubbing, Japanese Journal of Applied Phsyics, vol. 44, No. 1A, 2005, 4 pages.
Tabirian, N., et al., U.S. Appl. No. 61/757,259, filed Jan. 28, 2013, 29 pages.
Beam Engineering for Advced Measurements Co., et al., PCT Application No. PCT/US2016/038666 filed Jun. 22, 2016, Notification of Transmittal of the International Search Report and the Written Opinion of the International Searching Authority, or the Declaration dated Oct. 10, 2016, 16 pages.
Marrucci, et al., Pancharatnam-Berry phase optical elements for wave front shaping in the visible domain, Appl. Phys. Lett. 88, 2006, 3 pages.
Sobolewska et al., "On the inscription of period and half period surface relief gratings in azobenzene-functionalized polymers", J. Phys. Chem., vol. 112 (15) Jan. 3, 2008, 10 pages.
Barrett et al., Model of laser driven mass transport in thin films of dye-functionalized polymers, J. Chem. Phys., vol. 109 (4), Jul. 22, 1998, 13 pages.
Tabirian, U.S. Appl. No. 14/214,375, filed Mar. 14, 2014, Office Action Summary dated Jun. 27, 2017, 10 pages.
Tabirian, et al., U.S. Appl. No. 14/688,425, filed Apr. 16, 2015, Office Action Summary dated Oct. 5, 2017, 10 pages.
Serak, et al. Diffractive Waveplate Arrays [Invited], Journal of the Optical Society of America B, May 2017, pp. B56-B63, vol. 34, No. 5, 8 pages.
Emoto, et al., Optical and Physical Applications of Photocontrollable Materials: Azobenzene-Containing and Liquid Crystalline Polymers, Polymers, Jan. 2012, 150-186, vol. 4, 38 pages.
Tabirian, N., U.S. Appl. No. 14/194,808 filed Mar. 2, 2014, Office Action Summary dated Feb. 9, 2018, 10 pages.
Tabirian, N., U.S. Appl. No. 14/324,126 filed Jul. 4, 2014, Office Action Summary dated Feb. 8, 2018, 13 pages.
Tabirian, N., U.S. Appl. No. 15/189,551 filed Jun. 22, 2016, Office Action Summary dated Feb. 27, 2018, 16 pages.

* cited by examiner

FABRICATION OF HIGH EFFICIENCY, HIGH QUALITY, LARGE AREA DIFFRACTIVE WAVEPLATES AND ARRAYS

CROSS REFERENCE TO RELATED APPLICATION

This application is a continuation in part of U.S. patent application Ser. No. 13/860,934, entitled "Fabrication of High Efficiency, High Quality, Large Area Diffractive Waveplates and Arrays", filed Apr. 11, 2013 which is, in turn, a continuation of U.S. patent application Ser. No. 12/662,525, entitled "Fabrication of High Efficiency, High Quality, Large Area Diffractive Waveplates and Arrays", and filed Apr. 21, 2010.

STATEMENT REGARDING FEDERALLY SPONSORED RESEARCH OR DEVELOPMENT

This invention was made with Government support under Contract No. W911QY-07-C-0032.

RIGHTS OF THE GOVERNMENT

The invention described herein may be manufactured and used by or for the Government of the United States for all governmental purposes without the payment of any royalty.

FIELD OF THE INVENTION

This invention relates to fabrication of one- or two-dimensional diffractive waveplates and their arrays, those waveplates including "cycloidal" diffractive waveplates (DWs) or polarization gratings (PGs) with optical axis modulation along a single axis of a Cartesian coordinate system, axial waveplates, vortex waveplates, or q-plates with optical axis modulation in two dimensions, as well as including waveplates with essentially non-linear and aperiodic modulation of optical axis orientation.

BACKGROUND OF THE INVENTION

Polarization recording of holograms and related "polarization gratings" were conceived in 1970's as a method for recording and reconstructing the vector field of light. A light-sensitive material that acquired birefringence under the action of polarized light was suggested in the first studies (Sh. D. Kakichashvili, "Method for phase polarization recording of holograms," Sov. J. Quantum. Electron. 4, 795, 1974). Examples of such photoanisotropic media included colored alkaly halid crystals regarded particularly promising due to reversibility of the recording process consisting in optically altering the orientation of anisotropic color centers in the crystal. A medium possessing with photoinduced birefringence was used for polarization sensitive optical storage by Kawano et al. as disclosed in US Patent application US 2001/0002895.

A grating characterized only by spatial variations in the orientation of the induced optics axis can be obtained when the photoanisotropic medium is exposed to a constant intensity, rectilinear light vibrations, with spatially varying orientation, obtained from superposition of two orthogonal circularly polarized waves propagating in slightly different directions (M. Attia, et al., "Anisotropic gratings recorded from two circularly polarized coherent waves," Opt. Commun. 47, 85, 1983). The use of Methyl Red azobenzene dye in a polymer layer allowed to claim that photochemical processes in such material systems would enable obtaining 100% diffraction efficiency even in "thin" gratings (T. Todorov, et al., "High-sensitivity material with reversible photo-induced anisotropy," Opt. Commun. 47, 123, 1983). Highly stable polarization gratings with orthogonal circular polarized beams are obtained in thin solid crystalline Langmuir-Blodgett films composed of amphiphilic azo-dye molecules showing that "100% efficiency may be achieved for samples less than 1 μm thick" (G. Cipparrone, et al., "Permanent polarization gratings in photosensitive langmuir-blodget films," Appl. Phys. Lett. 77, 2106, 2000).

A material possesing birefringence that is not influenced by light is an alternative to the photoanisotropic materials that are typically capable of only small induced birefringence (L. Nikolova et al., "Diffraction efficiency and selectivity of polarization holographic recording," Optica Acta 31, 579, 1984). The orientation of such a material, a liquid crystal (LC), can be controlled with the aid of "command surfaces" due to exposure of the substrate carrying the command layer to light beams (K. Ichirnura, et al., "Reversible Change in Alignment Mode of Nematic Liquid Crystals Regulated Photochemically by Command Surfaces Modified with an Azobenzene Monolayer," Langmuir 4, 1214, 1988). Further a "mechanism for liquid-crystal alignment that uses polarized laser light" was revealed (W. M. Gibbons, et al., "Surface-mediated alignment of nematic liquid crystals with polarized laser light," Nature 351, 49, 1991; W. M. Gibbons, et al., "Optically controlled alignment of liquid crystals: devices and applications," Mol. Cryst. Liquid. Cryst., 251, 191, 1994). Due to localization of dye near the interface, the exposure can be performed in the absence of LC, and the LC is aligned with high spatial and angular resolution (potentially, submicron) after filling the cell (W. M. Gibbons, et al., "Optically generated liquid crystal gratings," Appl. Phys. Lett. 65, 2542, 1994). Variety of photoalignment materials are developed for achieving high-resolution patterns and obtaining variation of molecular alignment within individual pixels (M. Schadt, et al., "Optical patterning of multi-domain liquid-crystal displays with wide viewing angles," Nature 381, 212, 1996).

A critically important issue for producing LC orientation patterns at high spatial frequencies is their mechanical stability. Particularly, the cycloidal orientation of LCs obtained due to the orienting effect of boundaries is stable only when a specific condition between the material parameters, the cell thickness, and the period of LC orientation modulation is fulfilled (H. Sarkissian et al., "Periodically Aligned Liquid Crystal: Potential application for projection displays," Storming Media Report, A000824, 2004; H. Sarkissian, et al., "Periodically aligned liquid crystal: potential application for projection displays and stability of LC configuration," Optics in the Southeast 2003, Orlando, Fla.; Conference Program, PSE 02. and H. Sarkissian, et al., "Potential application of periodically aligned liquid crystal cell for projection displays," Proc. of CLEO/QELS Baltimore Md., poster JThE12, 2005; B. Ya. Zeldovich, N. V. Tabirian, "Devices for displaying visual information," Disclosure, School of Optics/CREOL, July 2000). Suggesting fabrication of cycloidal polarization gratings using the photoalignment technique with overlapping right and left circularly polarized beams, the publications by Sarkissian, Zeldovich and Tabirian cited above are credited for having theoretically proven polarization gratings can be 100% efficient and can be used as a diffractive grating for projection displays (C. Provenzano, et al., "Highly efficient liquid crystal based diffraction grating induced by polarization holograms at the aligning surfaces," Appl. Phys. Lett., 89, 121105, 2006; M. J. Escuti et al., "A polarization-independent liquid crystal spatial-light-modulator," Proc. SPIE 6332, 63320M, 2006).

LCs with spatially modulated orientation patterns produced using the photoalignment technique are known in the prior art (W. M. Gibbons, et al., "Surface-mediated alignment of nematic liquid crystals with polarized laser light," Nature 351, 49, 1991; C. M. Titus et al., "Efficient, polarization-independent, reflective liquid crystal phase grating," Appl. Phys. Lett. 71, 2239, 1997; J. Chen, et al., "An electro-optically controlled liquid crystal diffraction grating, Appl. Phys. Lett. 67, 2588, 1995; B. J. Kim, et al., "Unusual characteristics of diffraction gratings in a liquid crystal cell," Adv. Materials 14, 983, 2002; R.-P. Pan, et al., "Surface topography and alignment effects in UV-modified polyimide films with micron size patterns," Chinese J. of Physics 41, 177, 2003; A. Y.-G. Fuh, et al., "Dynamic studies of holographic gratings in dye-doped liquid-crystal films," Opt. Lett. 26, 1767, 2001; C.-J. Yu, et al., "Polarization grating of photoaligned liquid crystals with oppositely twisted domain structures," Mol. Cryst. Liq. Cryst. 433, 175, 2005; G. Crawford, et al., "Liquid-crystal diffraction gratings using polarization holography alignment techniques," J. of Appl. Phys. 98, 123102, 2005; Crawford et al., U.S. Pat. No. 7,196,758).

LC polymers were widely used as well (M. Schadt, et al. "Photo-Induced Alignment and Patterning of Hybrid Liquid Crystalline Polymer Films 011 Single Substrates," Jpn. J. Appl. Phys. 34, L764 1995; M. Schadt, et al. "Photo-Generation of Linearly Polymerized Liquid Crystal Aligning Layers Comprising Novel, Integrated Optically Patterned Retarders and Color Filters," Jpn. J. Appl. Phys. 34, 3240, 1995; Escutti et al, US Patent Application US2008/0278675). Photo-aligned anisotropic thin films can be applied to rigid or flexible substrates, which may be flat or curved and/or generate patterned retarders with continuous or periodical inplane variation of the optical axis (H. Seiberle, et al., "Photo-aligned anisotropic optical thin films," SID 03 Digest, 1162, 2003).

The CDWs wherein the optical axis of the material is periodically rotating in the plane of the waveplate along one axis of a Cartesian coordinate system are among the most interesting one-dimensional structures used for applications such as displays, beam steering systems, spectroscopy etc. These are known also as optical axis gratings, and polarization gratings (PGs) (S. R. Nersisyan, et al., "Optical Axis Gratings in Liquid Crystals and their use for Polarization insensitive optical switching," J. Nonlinear Opt. Phys. & Mat. 18, 1, 2009). Some interesting for applications two-dimensional orientation patterns possess with axial symmetry (N. V. Tabiryan, et al., "The Promise of Diffractive Waveplates," Optics and Photonics News 21, 41, 2010; L. Marucci, US Patent Application 2009/0141216; Shemo et al., US Patent Application 2010/0066929) and may have nonlinear dependence on coordinates.

It is important to introduce a clear distinction between polarization holograms, polarization gratings and diffractive waveplates as referenced to in further discussion. Polarization holograms are recorded with overlapping orthogonal polarized reference and pump beams in photoresponsive anisotropic materials. It is generally implied that the reference beam is spatially modulated and carries information.

The term "polarization grating" usually refers to a polarization hologram recorded with two orthogonal polarized beams that are not spatially modulated to carry information. Typically, these beams are equal in intensity and none can be singled out as reference.

Waveplates are thin anisotropic films with special conditions on orientation of optical axis and phase retardation $L(n_e-n_0)=\lambda/2$, where $n_e$ and $n_0$ are the principal values of refractive indices of the material, and L is the thickness, The optical axis orientation is spatially modulated in DWs. Particularly, CDWs present rotation of the optical axis of the material at a constant rate along a single axis of a Cartesian coordinate system. To the degree CDWs can be produced using holography techniques, they can be regarded as a subclass of polarization holograph y or polarization gratings.

Axial DWs (ADWs or vortx waveplates) are the polar analog of CDWs and cannot be obtained with polarization holography techniques. As mentioned above, DWs can possess with more complex optical axis modulation patterns, and they are distinguished with a specific phase retardation condition.

Thus, in the prior art, optical axis modulation patterns of anisotropic material systems were demonstrated, including in LCs and LC polymers, due to modulation of boundary alignment conditions, and it was shown that such boundary conditions can be achieved by a number of ways, including using photoaligning materials, orthogonal circular polarized beams, microrubbing, and substrate rotation (Fünfshilling et al., U.S. Pat. No. 5,903,330; B. Wen, et al., "Nematic liquid-crystal polarization gratings by modification of surface alignment," Appl. Opt. 41, 1246, 2002; S. C. McEldowney et al., "Creating vortex retarders using photoaligned LC polymers," Opt. Lett., Vol. 33, 134, 2008). LC optical components with orientation pattern created by exposure of an alignment layer to a linear polarized light through a mask, by scanning a linear polarized light beam in a pattern, or creating a pattern using an interference of coherent beams is disclosed in the U.S. Pat. No. 5,032,009 to Gibbons, et al. Also, in the prior art, "Optically controlled planar orientation of liquid crystal molecules with polarized light is used to make phase gratings in liquid crystal media" (W. M. Gibbons and S.-T. Sun, "Optically generated liquid crystal gratings," Appl. Phys. Lett. 65, 2542, 1994).

DWs are characterized by their efficiency, optical homogeneity, scattering losses, and size. While acceptable for research and development purposes, none of the techniques known in the prior art can be used for fabricating high quality DWs and their arrays in large area, inexpensively, and in high volume production. Since DWs consist of a pattern of optical axis orientation, they cannot be reproduced with conventional techniques used for gratings of surface profiles (J. Anagnostis, D. Rowe, "Replication produces holographic optics in volumes", Laser Focus World 36, 107, 2000; M. T. Gale, "Replicated diffractive optics and micro-optics", Optics and Photonics News, August 2003, p. 24).

It is the purpose of the present invention to provide method for the production of DWs of continuous patterns of optical axis orientation and controlling their spatial period. The printing method of the current invention does not require complex holographic setups, nor special alignment or vibration isolation as described in the publications S. R. Nersisyan, et al., "Optical Axis Gratings in Liquid Crystals and their use for Polarization insensitive optical switching," J. Nonlinear Opt. Phys. & Mat., 18, 1, 2009; S. R. Nersisyan, et al., "Characterization of optically imprinted polarization gratings," Appl. Optics 48, 4062, 2009 and N. V. Tabiryan, et al., "The Promise of Diffractive Waveplates," Optics and Photonics News, 21, 41, 2010, which are incorporated herein by reference.

Energy densities required for printing DWs are essentially the same as in the case of producing a waveplate in a holographic process. This makes fabrication of diffractive waveplates much faster compared to mechanical scanning or rotating techniques. A technique for obtaining polarization modulation patterns avoiding holographic setups was discussed earlier in the U.S. Pat. No. 3,897,136 to 0. Bryngdahl. It discloses a grating "formed from strips cut in different directions out of linearly dichroic polarizer sheets. The gratings were assembled so that between successive strips a constant amount of rotation of the transmittance axes occurred." These were also essentially discontinuous structures, with the angle between the strips $\pi/2$ and $\pi/6$ at the best. The size of individual strips was as large as 2 mm. Thus, such a grating modulated polarization of the output light at macroscopic scales and could not be used for production of microscale-period gratings with diffractive properties at optical wavelengths.

BRIEF SUMMARY OF THE INVENTION

Thus, the objective of the present invention is providing means for fabricating high quality DWs in large area, typically exceeding 1" in sizes, in large quantities, high yield, low cost.

Another objective of the present invention is providing means for fabricating DWs with different spatial periods of optical axis modulation.

Still another objective of the present invention is using radiation of visible wavelengths for fabricating DWs.

In one embodiment, the invention, particularly, includes converting a linear or unpolarized light, generally non-monochromatic, incoherent or partially coherent, into a light beam of a periodic pattern of polarization modulation and subjecting materials with capability of photoalignment to said pattern for time periods nearly an order of magnitude exceeding the times otherwise required for obtaining homogeneous orientation state.

Further objectives and advantages of this invention will be apparent from the following detailed description of presently preferred embodiment, which is illustrated schematically in the accompanying drawings.

BRIEF DESCRIPTION OF THE SEVERAL VIEWS OF THE DRAWINGS

FIG. IA shows the schematic of printing DWs.

FIG. IB schematically shows distribution of light polarization at the output of the linear-to-cycloidal polarization converter.

FIG. IC schematically shows distribution of light polarization at the output of a linear-to-axial polarization converter.

FIG. ID schematically shows distribution of light polarization at the output of a two-dimensional cycloidal polarization converter.

DETAILED DESCRIPTION OF THE INVENTION

Before explaining the disclosed embodiment of the present invention in detail it is to be understood that the invention is not limited in its application to the details of the particular arrangement shown since the invention is capable of other embodiments. Also, the terminology used herein is for the purpose of description and not limitation.

The preferred embodiment of the present invention shown in FIG. IA includes a light beam 101 incident upon an optical component 102 capable of converting the incident light beam 101 into a beam with spatially continuous modulated polarization pattern 103. Of particular interest are "cycloidal" and axial modulation patterns shown schematically in FIG. IB and FIG. IC, correspondingly, wherein the numerals 106 indicate the linear polarization direction at each point of the plane at the output of the polarization converter (S. R. Nersisyan, et al., "Characterization of optically imprinted polarization gratings," Appl. Optics 48, 4062, 2009). One polarization modulation period is shown in FIG. IB, and the polarization direction is reversed 4 times for the example of the axially modulated pattern shown in FIG. IC. Polarization modulation may have other distributions as exemplified by the two-dimensional cycloidal pattern shown in FIG. ID.

Figure 1A:
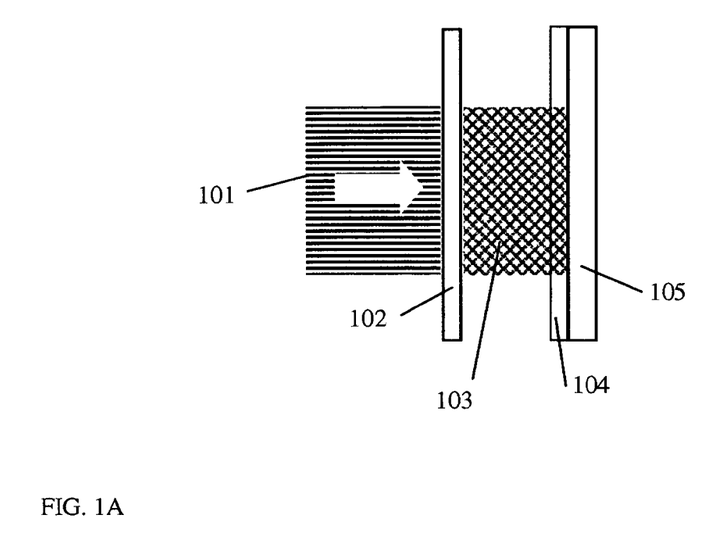
Figure 1B:
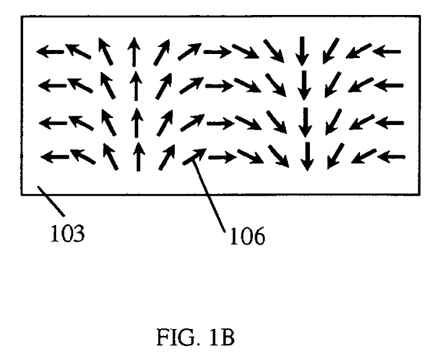
Figure 1C:
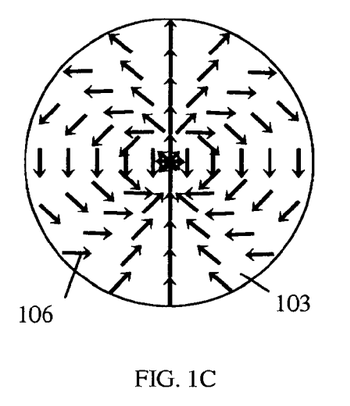
Figure 1D:
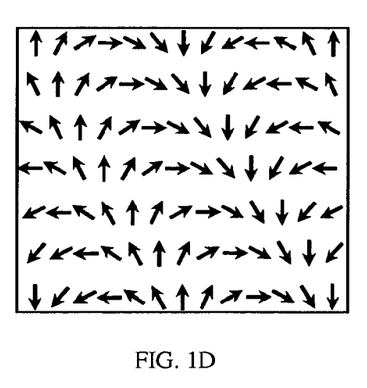

A photoresponsive material film 104 capable of producing an internal structure aligned according to the polarization pattern 103, deposited on a substrate 105, is arranged in the area with spatially modulated polarization pattern. Examples of such materials include photoanisotropic materials such as azobenzene or azobenzene dye-doped polymers, and photoalignment materials such as azobenzene derivatives, cinnamic acid derivatives, coumarine derivatives, etc.

Light beams of UV wavelengths are typically used for the photoalignment process, particularly when involving linearly polymerizable polymers. Certain azobenzene dyes, however, such as PAAD-27 commercially available at www.beamco.com, have peak absorption band at visible wavelengths and allow using beams of visible wavelengths of such common lasers as Argon-Ion (514 nm) and the second harmonic of Nd:YAG (532 nm) for photoalignment. Using radiation of visible wavelength has other advantages important from production standpoint. Unlike UV optics, the optical components, including polarizers, and optical coatings for visible wavelengths used in current invention do not quickly deteriorate in time when subject to radiation, and they are substantially less expensive compared to optical components and coatings for UV beams.

Any of the diffractive waveplates shown in FIG. IB, FIG. IC and FIG ID can be used as a polarization converter 102 in FIG. IA. Note that the diffractive waveplates in FIG. 1 are shown as examples only, and not for limitation. In the preferred embodiment of the present invention, any other diffractive waveplate that converts an input coherent beam into a spatially modulated linear polarized beam can be used in the scheme shown in FIG. IA.

Figure 2A:
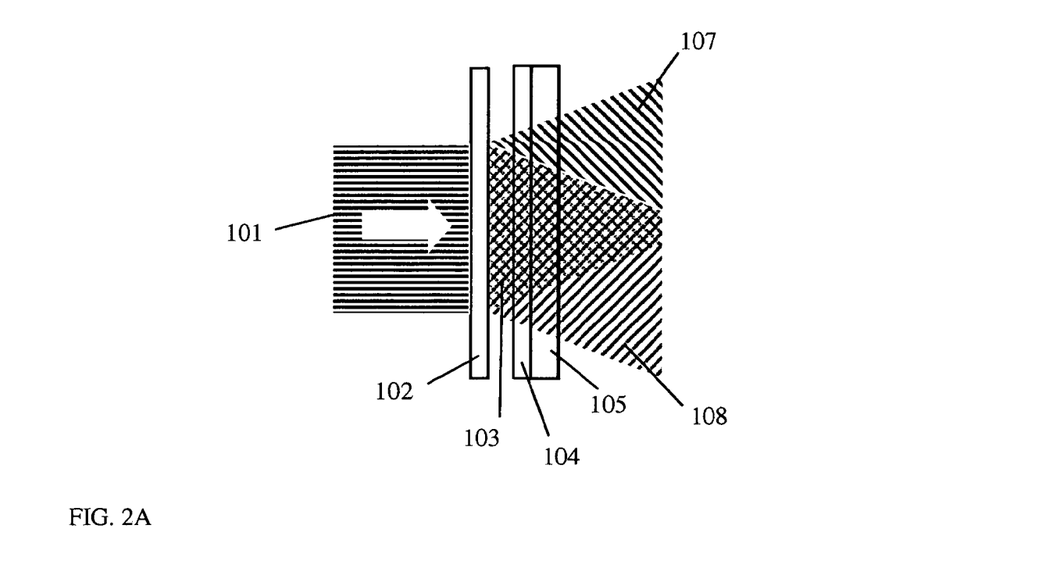
FIG. 2A shows the schematic of printing DWs using a CDW as a polarization converter.

In the particular example shown in FIG. 2A, a CDW is used as polarization converter 102. In order for a CDW to act as a polarization converter that generates cycloidal polarization modulation pattern in the overlap region of the diffracted beams 107 and 108, the input light needs to be polarized- and coherent. By that, half-wave phase retardation condition, $L(n_e-n_o)=\lambda/2$, where $n_e$ and $n_o$ are the principal values of refractive indices of the CDW used as a converter, and L is its thickness, needs to be met for the wavelength of a linear polarized input beam, and quarter-wave phase retardation condition, $L(n_e-n_o)=\lambda/4$, needs to be met for a circularly polarized input beam.

Both conditions specified in the current invention ensure linearly polarized output beam with spatially modulated polarization direction. Diffractive waveplates of spectrally broadband or achromatic performance can be used in the preferred embodiment as far as it includes the wavelength of radiation used for fabrication.

Polarization converters of current invention may be recorded holographically or obtained by other means. Holographic techniques do not apply to vortex waveplates (ADWs) and to more general patterns of aperiodic and/or nonlinear variation of optical axis orientation. "Pancharactnam lens" is an example of nonlinear variation of the optical axis orientation angle a with the polar coordinate r, $\alpha \sim r^2$ (Marrucci, et al., "Pancharatnam-Berry phase optical elements for wave front shaping in the visible domain: Switchable helical mode generation," Appl. Phys. Lett. 88, 221102 (1-3), 2006).

ADWs, for example, can be fabricated by mechanical circular buffing not even involving any photoresponsive polymer (M. Stalder, M. Schadt, "Linearly polarized light with axial symmetry generated by liquid-crystal polarization converters", Optics Letters Vol. 21, No. 23, pp. 1948-1950, 1996) or rotating the photoresponsive film in a strip of a linearly polarized light (N. V. Tabiryan, S. R. Nersisyan, H. Xianyu, E. Serabyn, Fabricating Vector Vortex Waveplates for Coronagraphy, Aerospace Conference, 2012 IEEE, pp 1-12). Cycloidal diffractive waveplates can also be fabricated using mechanical microrubbing with no photoalignment or otherwise photoresponsive films involved (M. Honma and T. Nose, "Polarization-independent liquid crystal grating fabricated by microrubbing process," Jpn. J. Appl. Phys., Part 1, Vol. 42, 6992-6997, 2003).

Figure 2B:
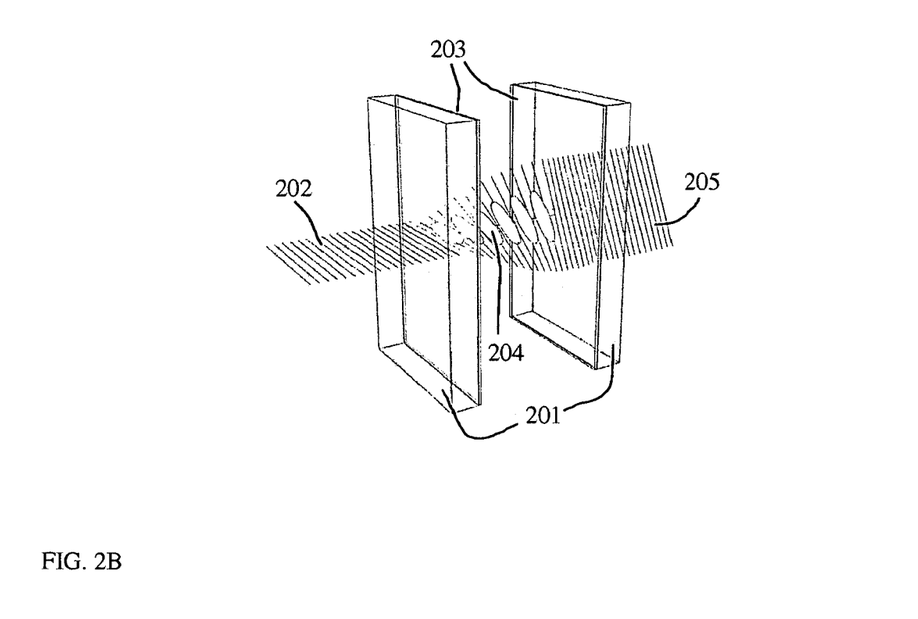
FIG. 2B shows achromatic polarization conversion capability of twist nematic liquid crystals.

A twisted nematic LC cell shown in. FIG. 2B is an example of a broadband polarization rotator that does not need to fulfill half-wave phase retardation condition (P. Yeh, C. Gu, Optics of Liquid Crystal Displays, Wiley, 2010, Section 4.3). The polarization of a linear polarized input light 201 propagating in a material where the molecules of the LC 204 rotate between the substrates 201 due to differently aligning conditions at the cell boundaries 203 follows the rotation of the LC orientation. Thus, the polarization of a light beam 205 is rotated at the exit of the cell at an angle determined by the orientation of the LC, hence, spatially modulating the LC rotation angle at the output substrate allows to spatially modulate the light polarization at the output of the device. The condition of so-called adiabatic following of polarization with rotation of the optical axis is met for all wavelength where $\lambda. \ll L(n_e-n_o)$ as well known in the prior art (P. Yeh, C. Gu, Optics of Liquid Crystal Displays, Wiley, 2010, Section 4.3).

Note that the light field at the output of the polarization converter can further be processed by optical projection and transformation means to widen the types of patterns that could be created. As an example, adding a polarizer at the output of the DW transforms the polarization modulation pattern into a pattern of intensity modulation that could be used for printing a variety of diffractive optical elements.

The simplicity of this method, its insensitivity to vibrations, noises, air flows, as opposed to the holographic techniques makes feasible manufacturing high quality DWs with high diffraction efficiency in large areas exceeding 1 inch in sizes and in large quantities with low cost.

A spatial light modulator was suggested by Konawa for polarization modulation in U.S. Patent Application US2001/0002895. Such a component is binary with two states only, p-polarization and s-polarization at application or non-application of voltage. The spatial light modulator used in Kawano's device does not provide an opportunity for rotating the polarization of light at any angle other than 90 degrees with respect to the incident beam polarization.

In contrast, the polarization converters used in our application have continuous structure with no pixels and provide light field with continuously modulated polarization. They are suitable for printing diffractive waveplate structures with high spatial resolution that cannot be achieved in pixelated systems.

The spatial period of the printed DW is equal to that of the DW used as a polarization converter when a circular polarized light is used in conjunction with a DW that meets quarter-wave phase retardation condition for the radiation wavelength. A linear polarized light, however, yields in a DW with twice shorter period of the optical axis modulation. This is evident, FIG. 3, in the photos of the structure of the DW 301 produced via printing using a linear polarized light beam as compared to the structure of the DW 302 used as a polarization converter. Photos were obtained under polarizing microscope with IOOx magnification (S. R. Nersisyan, et al., "Characterization of optically imprinted polarization gratings," Appl. Optics 48, 4062, 2009). This applies both to CDWs as well as to the diffractive waveplates with axial symmetry of optical axis orientation (ADWs) shown in FIG. 4 wherein the numeral 401 corresponds to the ADW used as a polarization converter, and 402 corresponds to the ADW obtained as a result of printing (N. V. Tabiryan, S. R. Nersisyan, D. M. Steeves and B. R. Kimball, The Promise of Diffractive Waveplates, Optics and Photonics News 21, 41, 2010). The technique of doubling the spatial frequency allows producing high degree ADWs and their arrays without using mechanical rotating setups.

Figure 3:
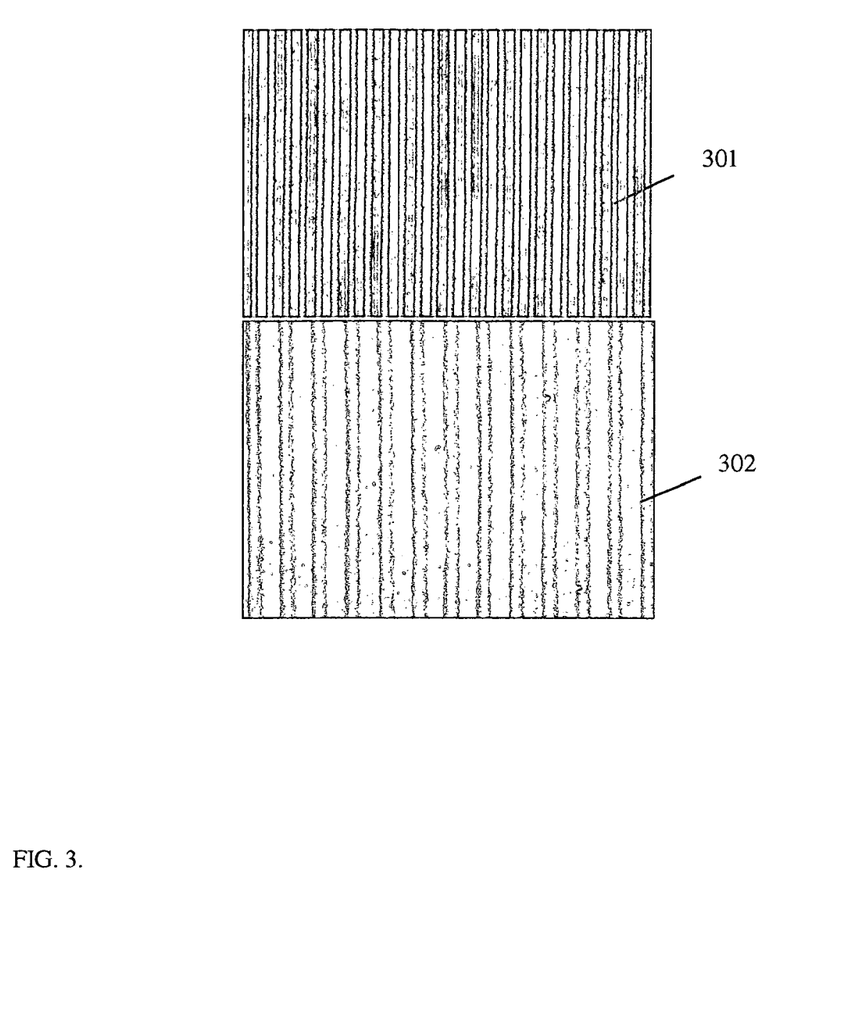
FIG. 3 shows spatial frequency doubling of a CDW in the printing process. Photos are obtained under polarizing microscope with I00× magnification.
Figure 4:
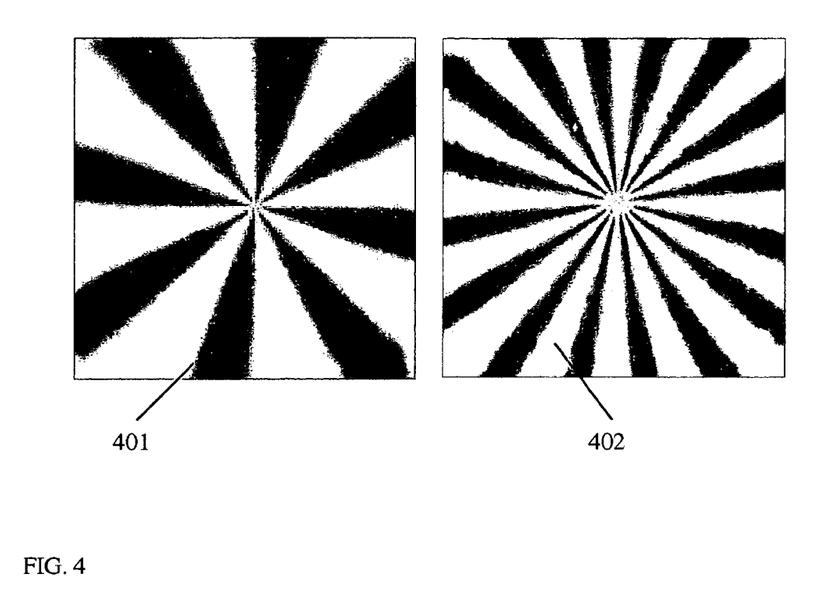
FIG. 4 shows two consecutive doubling of the order of an axially symmetric DW.

Each DW in these examples was obtained by deposition of a LC polymer on the substrate carrying the photoalignment layer. This process of LC polymer deposition involves spin coating, heating to remove residual solvents, and polymerization in an unpolarized UV light. Other coating techniques (spray coating, as an example) and polymerization techniques (heating, as an example) are known and can be used for this purpose. The period of the printed DWs can be varied also by incorporating an optical system that projects the cycloidal polarization pattern onto larger or smaller area or, in a preferred embodiment of the current invention, by combining, for example, CDWs in series. The diffraction angle, hence the pitch of the cycloidal pattern of polarization modulation in the overlap of the diffracted beams, may be continuously varied from 0 to double the angle achieved with a single CDW for different mutual orientations of CDWs. (S. R. Nersisyan, N. V. Tabiryan, L. Hoke, D. M. Steeves, B. Kimball, Polarization insensitive imaging through polarization gratings, Opt. Exp. 17 (3), 1817-1830, 2009).

Figure 5:
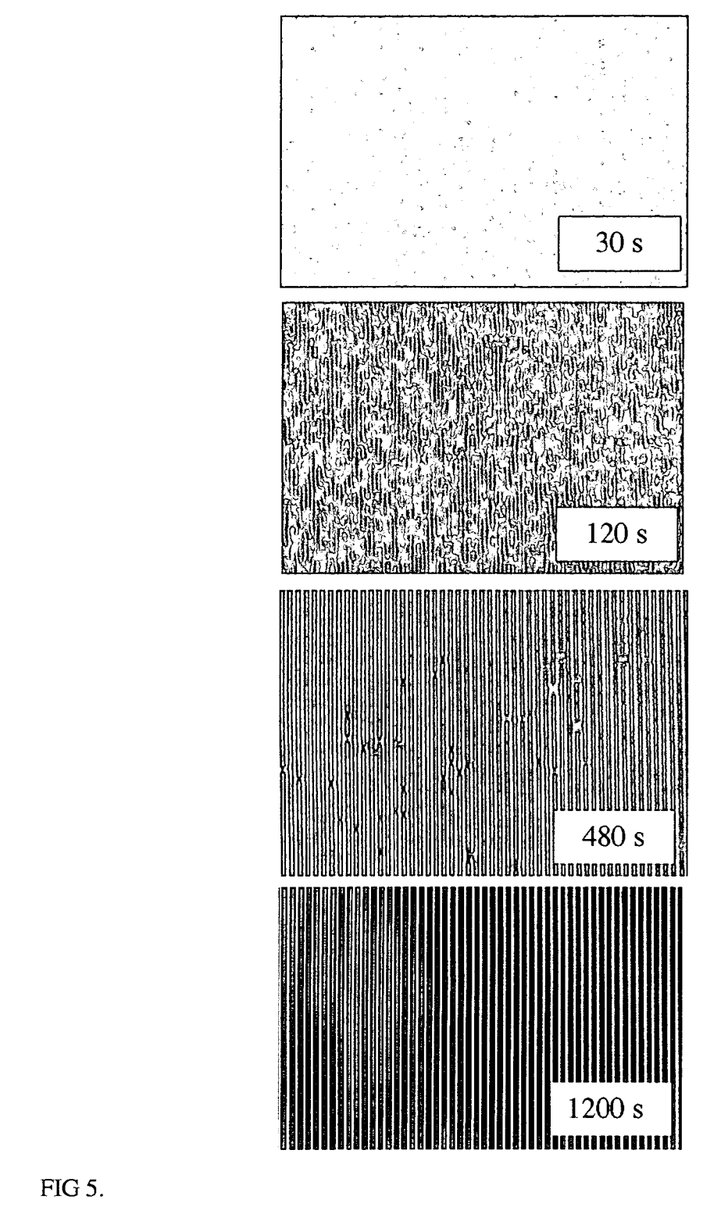
FIG. 5 shows photos of the structure of CDWs obtained under polarizing microscope for different exposure times. Photos are obtained under polarizing microscope with 40× magnification.

Another aspect of the present invention consists in the disclosure that the photoalignment materials need to be exposed to cycloidal polarization pattern of radiation for time periods considerably exceeding the exposure time required for obtaining homogeneous aligning films at a given power density level of radiation. As an example, ROLIC Ltd. specifies 50 $mJ/cm^2$ exposure energy density for its material ROP 103 at the wavelength 325 nm. Exposure with such an energy density yields in good homogeneous alignment, however, the structure of CDWs fabricated according to that recipe appears very poor under polarizing microscope as shown in FIG. 5. Extending the exposure time improves the structure, and practically defect-free structure is obtained for exposure energies >1 J/cm² that is 20× exceeding the specified values for this particular material.

An exposure dose range 0.5-2 mJ/cm² is specified by Escuti et al., "Polarization-independent LC microdisplays using liquid crystal polarization grating" A viable solution? "Presentation slide" July 2008 at ILCC'08 (30 pages). Note again that this statement is valid, only in part, for the particular material, ROP-103 from Rolic Ltd. in combination with the particular LC (MLC-12100 from Merck). As an example, the paper "Liquid-crystal diffraction gratings using polarization holography alignment techniques" by Crawford et al., published in J. of Appl. Phys., vol. 98, 123102, 2005, comments on the attempt of fabricating a polarization grating using a reactive mesogen (page 7): "Inspection of the microscope photograph in FIG. 9b shows a significant number of defects. These defects are attributed to the top air surface, which does not enforce planar anchoring conditions. One can of course use reactive mesogen materials and two aligning surfaces as described in Sec. IV A, to achieve near perfect alignment as observed in low molecular weight systems." Note "near perfect alignment" for low molecular weight LCs and "significant number of defects" for a reactive mesogen.

As another example, as disclosed in S. R. Nersisyan, et al., "Optical Axis Gratings in Liquid Crystals and their use for Polarization insensitive optical switching," J. Nonlinear Opt. Phys. & Mat., 18, 1-47, 2009, the photoalignment material ROP-203, also from Rolic Ltd., allows producing defectless and haze-free LC polymer polarization gratings for exposure dose of only 120 mJ/cm².

Thus, no exposure energy range can be specified as having significance for the technology in general. Our disclosures that:

a) there is a relationship between the defective structure and the exposure energy, and b) that defectless and haze-free DWs can be manufactured by increasing the anchoring strength of the photoalignment layer by means, in particular, of the increased exposure energy, and c) that the exposure energy required for such defectless and haze-free liquid crystal polymer DWs needs to be at least an order of magnitude higher than the energy required for obtaining homogeneous oriented LCP films (which is namely the parameter specified by material manufacturers), were neither understood nor used before.

The quality of DWs fabricated in conventional holographic process depends on many factors: the quality of the overlapping beams; the susceptibility of the holographic setup to mechanical vibrations and air fluctuations in the path of the beam; the coherence of the beams and equality of their paths; depolarization effects due to propagation of the beams through multiple optical elements such as lenses and beam splitters; the quality of the substrate; the qualities of the photoalignment materials, their affinity with the substrate in use and the effects of coating and solvent evaporation processes. These factors include the homogeneity of the LCs layer thickness, and their compatibility issues with the photoalignment layer. The compatibility of the LC materials with the photoalignment material is important as well. Typical thickness of these films is in the micrometer range, whereas thickness variation for as little as the wavelength of radiation, ~0.5 μm for visible wavelengths, can dramatically affect the diffraction efficiency of those components. The absolute value of the thickness is as important due to orientation instabilities that is determined, among other things, by the ratio of the layer thickness to the modulation period (H. Sarkissian, et al., "Periodically aligned liquid crystal: potential application for projection displays," Mol. Cryst. Liquid Cryst., 451, 1, 2006).

Among all these factors, the exposure energy, being a parameter easy to control and specified by its supplier appears to be the least suspected to affect the quality of the DW being fabricated. With all the noises, impurities, and uncertainties in man y steps involved in the process, the obtained component would still show relatively small areas of good quality, good enough for research, but beyond the acceptable limits for practical applications. Thus, relating the component imperfections to the exposure energy and the finding that the exposure times shall considerably exceed photoaligning material specifications provided for homogeneous orientation is critically important for fabrication of high quality DWs with homogeneous properties in a large area.

The reasons for such an effect of the exposure time lie, apparently, in the need to produce stronger forces to support a pattern of spatial modulation of the optical axis than those required for homogeneous alignment. Elastic forces against modulation of molecular orientation are strong in LC materials. Longer exposure induces stronger modulation of the microscopic orientation properties of the photoaligning materials. Anchoring energy of such materials for LCs are not comprehensively studied. The available data relate to homogeneous orientation (V. G. Chigrinov, et al., "Photoaligning: physics and applications in liquid crystal devices", Wiley VCH, 2008).

Due to robustness of the printing method to the mechanical and other ambient noise, large area components can be fabricated by continuously translating the substrate in the region of cycloidal polarization pattern. By that, the energy of the light beam can be distributed along a long strip to produce a larger photoalignment area.

Although the present invention has been described above by way of a preferred embodiment, this embodiment can be modified at will, within the scope of the appended claims, without departing from the spirit and nature of the subject invention.

What is claimed is:

1. An apparatus for non-holographically producing spatially continuous orientation modulation of an anisotropy axis of a photoresponsive material layer, comprising:
    (a) a device configured to output a polarized coherent light beam having a wavelength in a UV-visible part of spectrum;
    (b) a diffractive waveplate polarization converter transforming polarization of said light beam into a linear polarization state with a spatially continuous modulation pattern to provide a continually modulated polarization suitable for printing diffractive waveplate structure with high spatial resolution with smallest modulation feature sizes that would be comparable to or longer than the wavelength of the polarized coherent light beam;
    (c) a photoresponsive material having thickness as a small fraction of wavelength of said light beam, an absorption spectrum comprising at least part of UV-visible wavelengths and an anisotropy axis formed or aligned according to polarization of said light beam;
    (d) said photoresponsive material layer deposited on a substrate for exposure of at least a portion of said photoresponsive material layer to said light beam at the output of said diffractive waveplate polarization converter.

2. The apparatus as in claim 1 wherein the wavelength of said light beam is of a visible wavelength.

3. The apparatus as in claim 1 wherein
(a) said light beam is circularly polarized, and
(b) said diffractive waveplate polarization converter is a diffractive waveplate meeting quarter wave phase retardation condition for the wavelength of said light beam.

4. The apparatus as in claim 1 wherein
(a) said light beam is linearly polarized, and
(b) said polarization converter is a diffractive waveplate meeting half-wave phase retardation condition for the wavelength of said light beam.

5. The apparatus as in claim 1 wherein said diffractive waveplate polarization converter provides polarization modulation in more than one spatial dimension.

6. The apparatus as in claim 1 wherein said diffractive waveplate polarization converter provides polarization modulation that cannot be characterized with a single spatial period.

7. The apparatus as in claim 1 wherein said diffractive waveplate polarization converter is fabricated by non-holographic means including mechanical, electromagnetic, optical, chemical or a combination thereof.

8. The apparatus as in claim 1 wherein said diffractive waveplate polarization converter allows producing continuous patterns of linear polarization in a broad spectrum of wavelengths.

9. The apparatus as in claim 8 wherein
(a) said diffractive waveplate polarization converter is spectrally broadband;
(b) said photoresponsive material is photoresponsive within at least part of the spectral range of said diffractive waveplates; and
(c) the light beam comprises more than one wavelength within the spectral range of photoresponsivity of said photoresponsive material.

10. The apparatus of claim 1 wherein said diffractive waveplate polarization converter comprises more than one cycloidal diffractive waveplates combined to produce polarization modulation pattern at different spatial periods by varying the angle between the axes of said diffractive waveplates.

11. The apparatus of claim 1 further comprising optical means for projecting said polarization modulation pattern of said light beam onto at least a part of the area of said photoresponsive material layer, said projection generally changing the size, shape and topography of said polarization modulation pattern obtained at the output of said diffractive waveplate polarization converter.

12. The apparatus of claim 1 further comprising at least one substrate for controlling at least one of mechanical shape and stability, thermal conductivity, thickness homogeneity, radiation resistance, and resistance to adverse ambient conditions.

13. An apparatus for non-holographically producing spatially continuous orientation modulation of an anisotropy axis of a photoresponsive material layer, the apparatus comprising:
(a) a device configured to output a linearly polarized coherent light beam having a wavelength in UV-visible part of electromagnetic spectrum;
(b) a diffractive wave plate polarization converter continuously modulating the polarization of said light beam along at least a single axis to provide a continually modulated polarization suitable for printing diffractive waveplate structure with high spatial resolution pattern with smallest features that would be comparable to or longer than the wavelength of said linearly polarized coherent light beam not achievable in pixilated systems;
(c) a photoresponsive material having thickness as a small fraction of wavelength of said light beam, having an absorption spectrum comprising at least part of visible wavelengths, and an anisotropy axis that is formed or aligned according to polarization of said light beam;
(d) depositing said layer of photoresponsive material onto a substrate for holding and positioning a layer of said photoresponsive material;
(e) positioning and projecting said polarization modulation pattern of said light beam onto a part of the area of said photoresponsive material layer;
(f) exposing different areas of said photoresponsive material layer to said polarization modulation pattern while maintaining continuity of the pattern projected on said photoresponsive material layer.

14. The apparatus of claim 13 wherein holding and positioning the layer of said photoresponsive material include at least one of the following: a glass substrate; a polymer substrate, a drum, a translation stage, and a rotation stage.

15. The apparatus as in claim 14 wherein the exposing different areas of said photoresponsive material layer to said polarization modulation pattern includes at least one of the mechanical motions, translation in the direction perpendicular to the polarization modulation axis, and rotation.

16. A method for non-holographically producing spatially continuous orientation modulation of an anisotropy axis of a photoresponsive material layer at a predetermined spatial period, the method comprising the steps of:
(a) producing a linear polarized coherent light beam to provide a continually modulated polarization suitable for printing diffractive waveplate structure with high spatial resolution with smallest features comparable to or longer than the wavelength of said linear polarized coherent light beam;
(b) propagating said light beam through a diffractive waveplate, the diffractive waveplate having optical axis modulation period twice larger compared to said predetermined spatial period; and
(c) exposing a photoresponsive material layer to said light beam propagated through said diffractive waveplate, the photoresponsive material having the ability of producing an anisotropy axis modulated according to the polarization of said light beam.

17. The method of claim 16 further comprising at least one anisotropic material overlayer with a thickness at least twice smaller than a smallest feature size of orientation modulation pattern of the anisotropy axis of a photoresponsive material layer, wherein the optical axis in the volume of said overlayer has the ability of according to and under the influence of the anisotropy axis modulation pattern of the photoresponsive material layer.

18. A method as in claim 17 for fabricating high quality diffractive waveplates providing diffraction efficiency greater than 95% over an area of greater than 1 inch in diameter, and scattering losses less than 1% comprising:
exposing said photoresponsive material layer to said polarization modulation pattern for receiving exposure energy density exceeding at least 5 times the exposure energy density sufficient for producing waveplates with spatially homogeneous orientation of optical axis orientation of said anisotropic material overlayer.

19. The method of claim 17 wherein said optical axis modulation of at least one of said anisotropic material overlayers is continuously modulated within said overlayer in the direction perpendicular to the modulation plane of the anisotropy axis of said photoresponsive material layer.

\* \* \* \* \*